US008980379B2

(12) United States Patent
Hanawa et al.

(10) Patent No.: US 8,980,379 B2
(45) Date of Patent: Mar. 17, 2015

(54) GAS DISTRIBUTION SHOWERHEAD AND METHOD OF CLEANING

(75) Inventors: Hiroji Hanawa, Sunnyvale, CA (US); Kyawwin Maung, Daly City, CA (US); Hua Chung, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 447 days.

(21) Appl. No.: 12/870,465

(22) Filed: Aug. 27, 2010

(65) Prior Publication Data

US 2011/0052833 A1 Mar. 3, 2011

Related U.S. Application Data

(60) Provisional application No. 61/237,505, filed on Aug. 27, 2009.

(51) Int. Cl.
| | |
|---|---|
| *C23C 16/00* | (2006.01) |
| *C23C 16/513* | (2006.01) |
| *B08B 7/00* | (2006.01) |
| *C23C 16/44* | (2006.01) |
| *C23C 16/455* | (2006.01) |
| *H01L 21/67* | (2006.01) |

(52) U.S. Cl.
CPC ......... *C23C 16/4405* (2013.01); *C23C 16/4404* (2013.01); *C23C 16/45574* (2013.01); *H01L 21/67115* (2013.01)
USPC ...................................... 427/534; 427/248.1

(58) Field of Classification Search
None
See application file for complete search history.

(56) References Cited

U.S. PATENT DOCUMENTS

| | | | | |
|---|---|---|---|---|
| 3,998,180 | A | * | 12/1976 | Hawkins et al. ............... 118/666 |
| 4,592,306 | A | | 6/1986 | Gallego |
| 4,763,602 | A | | 8/1988 | Madan et al. |
| 5,376,580 | A | | 12/1994 | Kish et al. |
| 5,686,738 | A | | 11/1997 | Moustakas |
| 5,893,846 | A | * | 4/1999 | Bales et al. ...................... 606/32 |
| 6,274,496 | B1 | * | 8/2001 | Leusink et al. ............... 438/685 |
| 6,319,822 | B1 | * | 11/2001 | Chen et al. .................... 438/637 |
| 6,551,848 | B2 | | 4/2003 | Kwak et al. |
| 6,692,568 | B2 | | 2/2004 | Cuomo et al. |
| 7,255,898 | B2 | | 8/2007 | O'Donnell et al. |
| 7,368,368 | B2 | | 5/2008 | Emerson |

(Continued)

FOREIGN PATENT DOCUMENTS

| | | | |
|---|---|---|---|
| EP | 0541373 | A2 | 5/1993 |
| EP | 2055397 | A2 | 5/2009 |

(Continued)

OTHER PUBLICATIONS

Kahn, Surface and Coatings Technology, V201, 2007, p4653.*

(Continued)

*Primary Examiner* — Joseph Miller, Jr.
(74) *Attorney, Agent, or Firm* — Patterson & Sheridan, LLP

(57) ABSTRACT

During a deposition process, material may deposit not only on the substrate, but also on other chamber components. In a MOCVD chamber, one of those components is the gas distribution showerhead. The showerhead may be cleaned by bombarding the showerhead with radicals generated by a plasma that includes an inert gas and chlorine. In order to generate the plasma, the showerhead may be negatively biased or floating relative to the substrate support. The showerhead may comprise stainless steel and be coated with a ceramic coating.

13 Claims, 9 Drawing Sheets

(56) References Cited

U.S. PATENT DOCUMENTS

| | | | |
|---|---|---|---|
| 7,605,086 | B2 | 10/2009 | O'Donnell et al. |
| 7,611,915 | B2 | 11/2009 | Slater, Jr. et al. |
| 7,838,315 | B2 | 11/2010 | Yang et al. |
| 2001/0035127 | A1 | 11/2001 | Metzner et al. |
| 2002/0086153 | A1 | 7/2002 | O'Donnell et al. |
| 2003/0170983 | A1* | 9/2003 | Basceri et al. ........... 438/683 |
| 2004/0002221 | A1 | 1/2004 | O'Donnell et al. |
| 2004/0099285 | A1* | 5/2004 | Wang et al. ............... 134/8 |
| 2004/0231706 | A1 | 11/2004 | Bhatnagar et al. |
| 2005/0016568 | A1* | 1/2005 | Choe et al. ............. 134/100.1 |
| 2006/0174815 | A1 | 8/2006 | Butcher et al. |
| 2008/0272463 | A1 | 11/2008 | Butcher et al. |
| 2008/0282978 | A1 | 11/2008 | Butcher et al. |
| 2009/0000743 | A1* | 1/2009 | Iizuka ................. 156/345.34 |
| 2009/0020768 | A1 | 1/2009 | Butcher et al. |
| 2009/0095218 | A1* | 4/2009 | Meinhold et al. ........... 118/708 |
| 2009/0095221 | A1 | 4/2009 | Tam et al. |
| 2009/0095222 | A1 | 4/2009 | Tam et al. |
| 2010/0210067 | A1 | 8/2010 | Butcher |

FOREIGN PATENT DOCUMENTS

| | | |
|---|---|---|
| JP | 2009-21624 A | 1/2009 |
| JP | 2009010101 A | 1/2009 |

OTHER PUBLICATIONS

Borland, John O. "Silicon Epitaxial Equipment and Processing Advances for Bipolar Base Technology", Advance Silicon Deposition, IEEE 1992 Bipolar Circuits and Technology Meeting 1.1. p. 16-21.

Hendriks, M. "Interface Engineering in Silicon Semiconductor Processing Using a Vacuum Cluster Tool", Microelectronic Engineering 25 (1994) 185-200.

J. R. Shealy, "Characterization of AlGaAs/GaAs Heterostructures Grown in a Multichamber OMVPE Apparatus ", Journal of Crystal Growth 87 (1988) 350-356.

PCT International Search Report for Application No. PCT/US2010/047009, mailed Mar. 30, 2011.

Chinese Office Action dated Mar. 25, 2014 for Application No. 201080019536.8.

\* cited by examiner

GAS DISTRIBUTION SHOWERHEAD AND METHOD OF CLEANING

CROSS-REFERENCE TO RELATED APPLICATIONS

This application claims benefit of U.S. Provisional Patent Application 61/237,505 (APPM/12242L), filed Aug. 27, 2009, which is incorporated by reference herein.

BACKGROUND OF THE INVENTION

1. Field of the Invention

Embodiments of the present invention generally relate to methods and apparatus for cleaning showerheads, such as those used for metal organic chemical vapor deposition (MOCVD) and/or hydride vapor phase epitaxy (HVPE).

2. Description of the Related Art

Chemical vapor deposition (CVD) chambers are typically utilized in the manufacture of semiconductor devices. A gas distribution showerhead is typically utilized to deliver precursors to a processing zone above a substrate located in the chamber, to deposit materials, such as thin films, onto the substrate. The gas distribution showerhead, as well as other hardware components in proximity of the processing zone in these chambers, such as the chamber body, is generally fabricated from low emissivity materials, such as aluminum. The aluminum surfaces are typically anodized to resist oxidation and/or corrosion. However, aluminum components may not be suitable for high temperature CVD processes, such as processes requiring temperatures in excess of 500 degrees C. to about 1400 degrees C. due, at least in part, to thermal expansion and contraction of aluminum materials. Further, the elevated processing temperatures may exceed the melting point of aluminum.

Other materials for use in high temperature CVD processes have been investigated. One of these materials is ceramic, which is corrosion resistant, has a low reflectance and is capable of withstanding elevated processing temperatures without deformation. However, some processes, such as chamber cleaning processes, require plasma formation facilitated by an electrical bias between the gas distribution showerhead and other components in the chamber. The dielectric properties of ceramic materials are not suitable to deliver electrical signals to facilitate plasma formation in these processes.

Another of theses materials is stainless steel, which is relatively corrosion free, has a high reflectance and low emissivity, and it suffers a slow rate of oxidation as compared to other metals such as aluminum. Stainless steel is conductive and may be effectively utilized to facilitate plasma formation. However, stainless steel has a low emissivity, is subject to oxidation, and must be cleaned or de-oxidized periodically.

In high temperature CVD processes, temperatures in the processing zone are desired to be stable to provide repeatable wafer-to-wafer and within-wafer deposition results. One factor affecting the temperature in the processing zone is the emissivity of the chamber hardware. When the chamber hardware is in a new condition, i.e., non-oxidized or corroded by process gas chemistries, the emissivity is known and is typically low. However, during processing, the emissivity of these materials may change due to adhesion of precursor materials on the exposed surfaces, or corrosion or oxidation of these exposed surfaces. The emissivity change affects thermal parameters in the processing zone, which causes process drift. Before the condition of the process components affects the process condition adversely, the chamber components must be cleaned or replaced.

The hardware components are typically cleaned on a schedule, such as after they are exposed to process conditions for a certain number of hours determined experimentally such that at the end of the period, the process yields acceptable deposition results on the substrate despite the process drift. The cleaning of the components is intended to restore the component to its original condition, and thus restore the process chamber to a condition where it would perform as though new, clean components were installed therein. However, it has been found, in particular with respect to non-ceramic chamber components, that the components when cleaned do not result in the chamber performing at the same condition as it had when the components were new. Then, in use, the cleaned components likewise exhibit emissivity changes, in the same manner as new components. Because the chamber properties are different, as compared to new components, when the cleaned components are first installed, using the cleaned components for the same process period as new components results in process conditions which may yield unacceptable deposition results on substrates.

Therefore, there is a need for a gas distribution showerhead, and other components in proximity of the processing zone in these chambers, that reduces process drift and enables a closer emissivity match between new and cleaned components. Additionally, there is a need for a method of cleaning to produce a repeatable surface.

SUMMARY OF THE INVENTION

The present invention generally provides improved methods for surface coatings applied to process chamber components utilized in chemical vapor deposition (CVD) processes and apparatus utilized in CVD processes having a surface coating according to embodiments described herein. In one embodiment, a showerhead apparatus is provided. The showerhead apparatus comprises a body, a plurality of conduits extending through the body, each of the plurality of conduits having an opening extending to a processing surface of the body, and a coating disposed on the processing surface, the coating being about 50 microns to about 200 microns thick and comprising a coefficient of emissivity of about 0.8, an average surface roughness of about 180 micro-inches to about 220 micro-inches, and a porosity of about 15% or less.

In another embodiment, a deposition chamber is provided. The deposition chamber comprises a chamber body having an interior volume contained between interior surfaces of the chamber body, interior surfaces of a gas distribution showerhead, and interior surfaces of a dome structure, a substrate support disposed in the interior volume in an opposing relationship to the gas distribution showerhead, and one or more lamp assemblies directing light through the dome structure. The gas distribution showerhead comprises a body, a plurality of conduits disposed in the body, each of the plurality of conduits having an opening extending to the interior surface of the body to deliver one or more gases to the interior volume, and a coating disposed on the interior surfaces of the gas distribution showerhead.

In another embodiment, a method for processing a substrate is provided. The method includes applying a coating to one or more surfaces of a body surrounding a processing volume in a chamber, transferring a first batch of one or more substrates to the processing volume of the chamber, providing an input energy to heat the first batch of one or more substrates to a set-point temperature to perform a first deposition process on the one or more substrates, transferring the one or more substrates out of the processing volume, transferring a second batch of one or more substrates to the processing volume of the chamber, and heating the second batch of one or more substrates to the set-point temperature to perform a second deposition process on the one or more substrates, wherein the set-point temperature is maintained by varying the input energy by less than about 0.12%.

In one embodiment, an apparatus is disclosed. The apparatus includes a chamber body and a substrate support pedestal disposed within the chamber body. The apparatus also includes a gas distribution showerhead electrically insulated from the chamber body, disposed opposite the substrate support pedestal and having a showerhead body comprising stainless steel and a ceramic coating thereover facing the substrate support. The showerhead body has a plurality of first gas passages and a plurality of second gas passages extending therethrough. The apparatus also includes a power supply coupled one or more of the substrate support and the showerhead body. A first gas supply is coupled to the showerhead body to deliver gas through the plurality of first gas passages and a second gas supply coupled to the showerhead body to deliver gas through the plurality of second gas passages.

In another embodiment, a method of cleaning a gas distribution showerhead is disclosed. The method includes introducing a cleaning gas to a processing chamber and applying an electrical bias to a gas distribution showerhead that is coupled to the processing chamber while a substrate support disposed opposite the showerhead is electrically grounded. The showerhead has a showerhead body comprising stainless steel and a ceramic coating there over facing the substrate support. The showerhead body has a plurality of first gas passages and a plurality of second gas passages extending therethrough. The electrical bias ignites the cleaning gas into a plasma containing cleaning gas radicals. The method also includes reacting the cleaning gas radicals with deposits formed on the ceramic coating by bombarding the ceramic coating with the cleaning gas radicals to form a byproduct and expose the ceramic coating. The exposed ceramic coating has an emissivity within 2 percent of the emissivity of the ceramic coating prior to formation of the deposits thereon. The method also includes exhausting the byproduct from the processing chamber.

In another embodiment, a method of cleaning a gas distribution showerhead is disclosed. The method includes introducing a cleaning gas to a processing chamber and applying an electrical bias to a substrate support disposed within the processing chamber while a gas distribution showerhead that is coupled to the processing chamber is electrically grounded. The showerhead has a showerhead body comprising stainless steel and a ceramic coating thereover facing the substrate support. The showerhead body has a plurality of first gas passages and a plurality of second gas passages extending therethrough. The electrical bias ignites the cleaning gas into a plasma containing cleaning gas radicals. The method also includes reacting the cleaning gas radicals with deposits formed on the ceramic coating by bombarding the ceramic coating with the cleaning gas radicals to form a byproduct and expose the ceramic coating. The exposed ceramic coating has an emissivity within 2 percent of the emissivity of the ceramic coating prior to formation of the deposits thereon. The method also includes exhausting the byproduct from the processing chamber.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
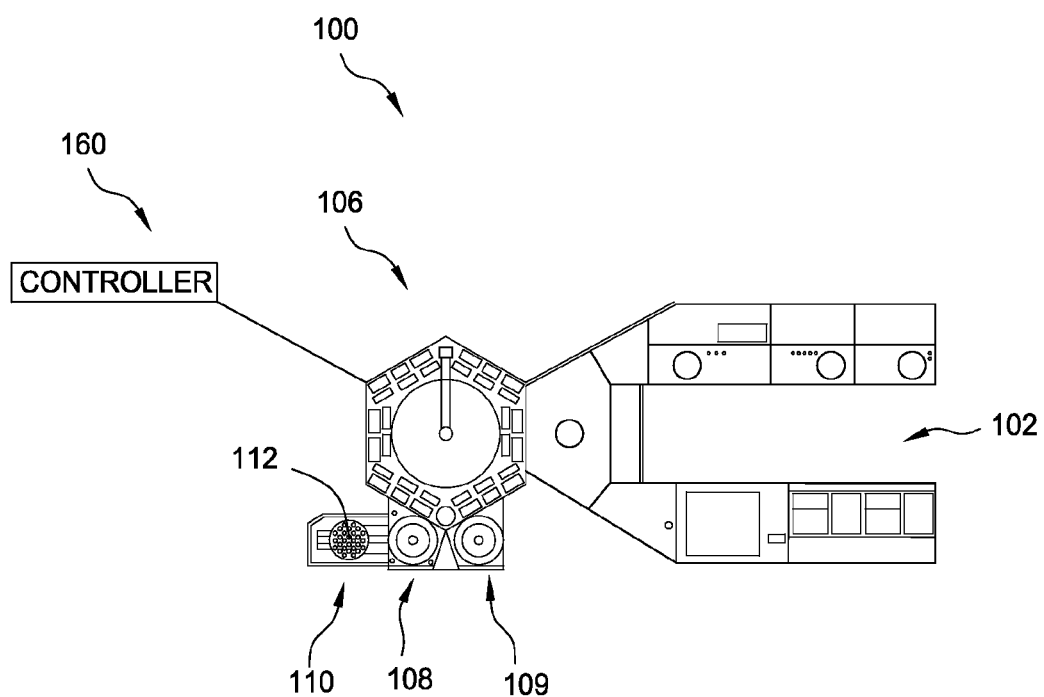
FIG. 1 is a schematic plan view illustrating one embodiment of a processing system for fabricating semiconductor devices according to embodiments described herein.

Embodiments of the present invention generally provide methods and apparatii for chamber components utilized in a chemical vapor deposition (CVD) process. In one embodiment, the method and apparatus may be utilized for deposition of Group III-nitride films using metal organic chemical vapor deposition (MOCVD) and/or hydride vapor phase epitaxy (HVPE) hardware. In one aspect, a processing chamber suitable for depositing materials to form a light emitting diode (LED), a laser diode (LD), or other device is provided.

Process temperature in CVD deposition affects film formation rate and film properties. The substrate or wafer must receive the same, within reasonable tolerance, deposition rate and film quality over its life. CVD chambers may be adapted to perform one or more deposition processes on single substrates or wafers, or a batch of substrates or wafers. The process temperature between a process-run (i.e., from substrate to substrate or batch to batch) will tend to drift because the emissivity of the chamber components changes and thus the wafer will temperature drift. To ameliorate this, other controls, such as the heat put into the chamber, and the heat withdrawn from the chamber, may need to be changed to maintain the desired process temperatures. The emissivity changes because the chamber component surfaces become covered with deposition materials or become corroded, i.e., oxidized or otherwise chemically modified. As a result, the parts in the chamber are periodically cleaned, in an attempt to restore them to their original pre-process condition. One mechanism to avoid the corrosion issue is to use ceramic parts which do not significantly degrade during use, and are readily restored to their original thermal property impacting condition by cleaning. However, ceramic chamber parts are subject to many process, performance and manufacturing limitations that make them expensive or impractical for use in some semiconductor process applications.

One alternative to using ceramic as a base material for chamber components is the use of a metal, for example. Stainless steel is relatively corrosion free, has a high reflectance and low emissivity when in a virgin condition, i.e., non-oxidized or corroded by process gas chemistries, and it suffers a slow rate of oxidation as compared to other metals, such as aluminum, which is also commonly used for chamber components. Stainless steel also has a high melting point, and can be used at temperatures where aluminum components will sag or even melt. However, stainless steel also oxidizes, and must be cleaned or de-oxidized periodically, to maintain the desired reflectance, emissivity and cleanliness of the surfaces thereof that is exposed to the chamber process environment. Typically, chamber parts are cleaned in-situ, by using a cleaning gas, such as passing a cleaning gas through a remote plasma source to provide highly reactive radicals to remove oxidation or other impurities from the surface of a component. This allows the chamber to be cleaned without breaking vacuum, and thus reduces the time the chamber is not ready for processing of substrates therethrough. Periodic cleaning by removing the parts is also needed, commonly after multiple cleaning and process cycles.

Despite the ability to clean the chamber surfaces in-situ, it has been found that the stainless steel surface does not recover to its original state after cleaning, or, does not repeatedly recover to that state. As a result, the reflectance and emissivity of the component which is desired to be that of new component, is at a different state, and as a result the process temperature and temperature uniformity are different than that which is desired or expected.

The inventors herein have discovered that coating the chamber components, in particular metal chamber components used in lamp heated CVD chambers, enables stabilization of the emissivity characteristics thereof over multiple processing and/or cleaning cycles. The term emissivity refers to the ratio of radiation emitted by a surface to the radiation emitted by a blackbody at the same temperature.

FIG. 1 is a schematic plan view illustrating one embodiment of a processing system 100 that comprises one or more CVD chambers 102 for depositing thin films onto a substrate. The processing system 100 comprises a transfer chamber 106, a CVD chamber 102 coupled with the transfer chamber 106, a loadlock chamber 108 coupled with the transfer chamber 106, a batch loadlock chamber 109, for storing substrates, coupled with the transfer chamber 106, and a load station 110, for loading substrates, coupled with the loadlock chamber 108. The processing system 100 also includes a controller 160. The transfer chamber 106 comprises a robot assembly (not shown) operable to pick up and transfer substrates between the loadlock chamber 108, the batch loadlock chamber 109, and the CVD chamber 102. More than one CVD chamber 102 or additionally, combinations of MOCVD chambers with one or more HVPE chambers may also be coupled with the transfer chamber 106.

Figure 2:
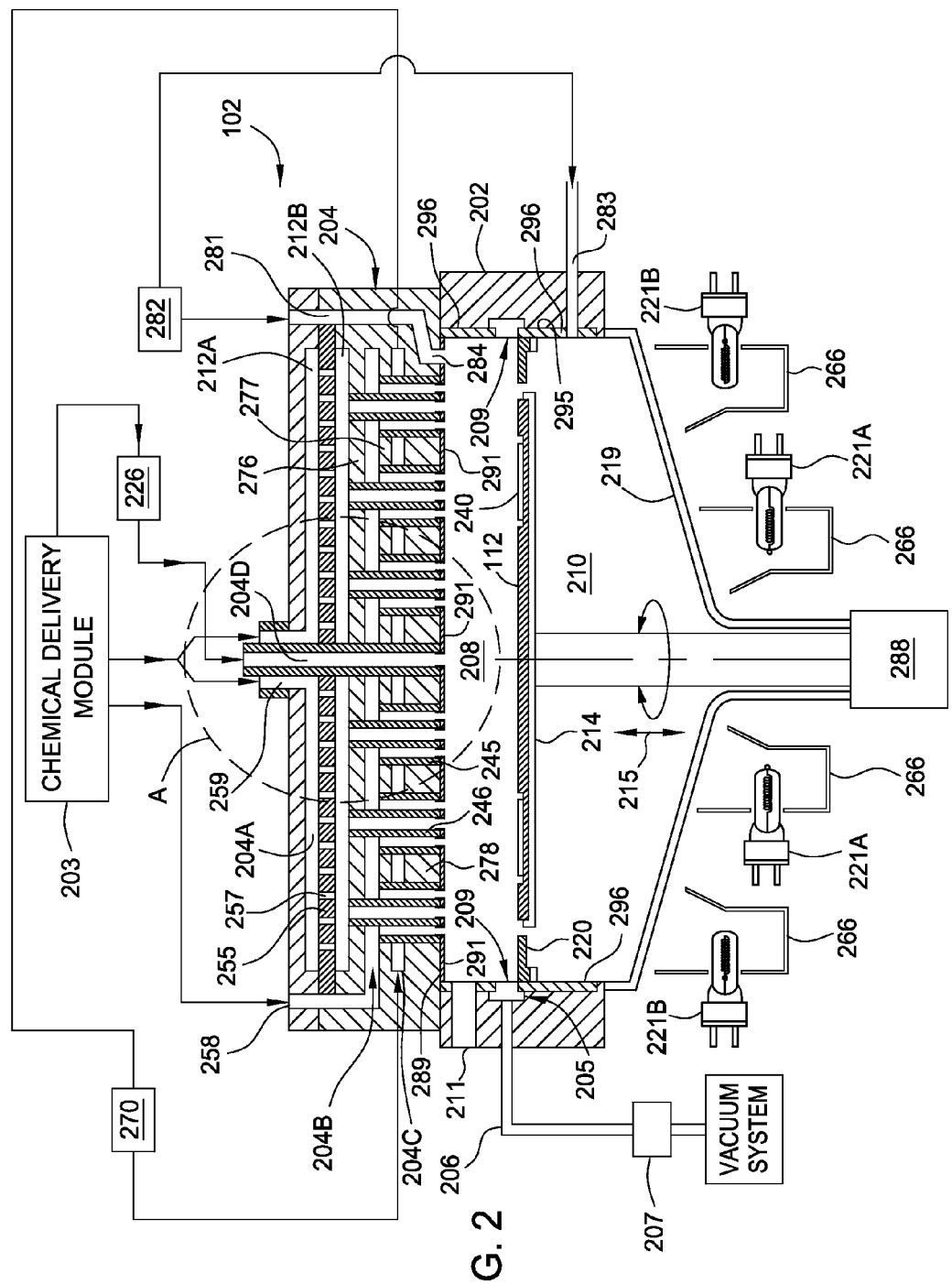
FIG. 2 is a schematic cross-sectional view of a chemical vapor deposition (CVD) chamber for fabricating semiconductor devices according to one embodiment of the present invention.

In the processing system 100, the robot assembly (not shown) transfers a substrate carrier plate 112 loaded with substrates through a slit valve (not shown) and into the single CVD chamber 102 to undergo chemical vapor deposition. In the embodiment described herein, the substrate carrier plate 112 is configured to receive a plurality of substrates in a spaced relationship as shown in FIG. 2. After some or all deposition steps have been completed, the substrate carrier plate 112 having the substrates thereon are transferred from the CVD chamber 102 via the robot assembly for further processing.

FIG. 2 is a schematic cross-sectional view of the CVD chamber 102 according to embodiments of the present invention. The CVD chamber 102 comprises a chamber body 202, a chemical delivery module 203 for delivering precursor gases, carrier gases, cleaning gases, and/or purge gases, a remote plasma system 226 with a plasma source, a susceptor or substrate support 214 for supporting a substrate carrier plate 112, and a vacuum system. A sealable opening 211 is provided in the chamber body 202 for transfer of the substrate carrier plate 112 into and out of the chamber 102. The opening is sealable by a slit valve (not shown). The chamber body 202 encloses a processing volume 208. A gas distribution showerhead assembly 204 is disposed at one end (top) of the processing volume 208, and the substrate support 214 is disposed at the other end (bottom) of the processing volume 208 in facing relationship with the gas distribution showerhead assembly 204. The substrate support 214 and substrate carrier plate 112 may be fabricated from silicon carbide, graphite, quartz, alumina, aluminum nitride, and combinations thereof. The substrate support 214 has z-lift capability for moving in a vertical direction, as shown by arrow 215. In one embodiment, the z-lift capability may be used to move the substrate support 214 upwardly, and closer to the showerhead assembly 204, and downwardly, and further away from the gas distribution showerhead assembly 204. An actuator 288 is used to impart both rotational movement as well as vertical movement. In certain embodiments, the substrate support 214 comprises a heating element (e.g., a resistive heating element (not shown)) for controlling the temperature of the substrate support 214 and consequently controlling the temperature of the substrate carrier plate 112 and substrates 240 positioned on the substrate carrier plate 112 and the substrate support 214. One or more sensors (not shown), such as a thermocouple, may be coupled to the substrate support 214 to monitor the temperature of the substrate support 214 and/or the backside of the substrate carrier plate 112 during processing.

In the embodiment shown, the gas distribution showerhead assembly 204 is configured as a double plenum showerhead, which allows two different gas streams to be distributed by the showerhead without those gas streams mixing together within the showerhead. Thus, the gas distribution showerhead assembly 204 has a first processing gas plenum 204A coupled with the chemical delivery module 203 via a first processing gas inlet 259 for delivering a first precursor or first process gas mixture to the processing volume 208, and a second processing gas plenum 204B for delivering a second precursor or second process gas mixture to the processing volume 208. In one embodiment, the chemical delivery module 203 is configured to deliver a metal organic precursor to the first processing gas plenum 204A and the second processing gas plenum 204B. In one example, the metal organic precursor comprises a suitable gallium (Ga) precursor (e.g., trimethyl gallium ("TMG"), triethyl gallium (TEG)), a suitable aluminum precursor (e.g., trimethyl aluminum ("TMA")), or a suitable indium precursor (e.g., trimethyl indium ("TMI")). In the embodiment shown in FIG. 2, the first processing gas plenum 204A is bi-furcated into two sub-plenums 212A and 212B by a blocker plate 255 positioned across the first processing gas plenum 204A. The blocker plate 255 has a plurality of orifices 257 disposed therethrough that provide fluid communication between the two sub-plenums 212A, 212B. The sub-plenum 212A is in communication with a first processing gas inlet 259 and the first processing gas plenum 204A for uniformly distributing gas received from the chemical delivery module 203 into the sub-plenum 212A and through the orifices 257 into the sub-plenum 212B of the first processing gas plenum 204A. The second processing gas plenum 204B coupled with the chemical delivery module 203 for delivering a second precursor or second process gas mixture to the processing volume 208 via a second processing gas inlet 258. In one embodiment, the chemical delivery module 203 is configured to deliver a suitable nitrogen containing processing gas, such as ammonia ($NH_3$) or other MOCVD or HVPE processing gas, to the second processing gas plenum 204B. In one embodiment, the second processing gas plenum 204B is separated from the first processing gas plenum 204A by a first plenum wall 276 of the gas distribution showerhead assembly 204.

The gas distribution showerhead assembly 204 further comprises a temperature control plenum 204C coupled with a heat exchanging system 270 for flowing a thermal control fluid through the gas distribution showerhead assembly 204 to help regulate the temperature of the gas distribution showerhead assembly 204. Suitable thermal control fluids include, but are not limited to, water, water-based ethylene glycol mixtures, a perfluoropolyether (e.g., GALDEN® fluid), oil-based thermal transfer fluids, or similar fluids. In one embodiment, the second processing gas plenum 204B is separated from the temperature control plenum 204C by a second plenum wall 277 of the gas distribution showerhead assembly 204. The temperature control plenum 204C may be separated from the processing volume 208 by a third wall 278 of the gas distribution showerhead assembly 204.

The chamber 102 comprises a lower dome 219 containing a lower volume 210 of the processing volume 208. Thus, the processing volume 208 is contained between the gas distribution showerhead assembly 204 and the lower dome 219. A substrate support 214 is shown in an elevated, process position, but may be moved to a lower position where, for example, the substrate carrier plates 112 having substrates 240 thereon may be loaded or unloaded. An exhaust ring 220 is disposed around the periphery of the substrate support 214 to help prevent deposition from occurring in the lower volume 210 and also help direct exhaust gases from the chamber 102 to exhaust ports 209. The lower dome 219 may be made of transparent material, such as high-purity quartz, to allow light to pass through for radiant heating of the substrates 240. The radiant heating may be provided by a plurality of inner lamps 221A and outer lamps 221B disposed below the lower dome 219. Reflectors 266 may be used to help control exposure of the chamber 102 to the radiant energy provided by the inner and outer lamps 221A, 221B. Additional rings of lamps (not shown) may also be used for finer temperature control of the substrates 240. In one embodiment, the chamber 102 includes between about 60 and about 85 lamps 221A and 221B, such as about 68 lamps 221A and 221B. In one aspect, each of the lamps 221A and 221B are quartz halogen lamps rated at 2 kilo Watts (kW).

In certain embodiments of the present invention, a purge gas (e.g., a nitrogen containing gas) may be delivered into the chamber 102 from the gas distribution showerhead assembly 204 through one or more purge gas plenums 281 (only one is shown) coupled to a purge gas source 282. In this embodiment, the purge gas is distributed through a plurality of orifices 284 disposed about the periphery of the gas distribution showerhead assembly 204. The plurality of orifices 284 may be configured in a circular pattern about the periphery of the gas distribution showerhead assembly 204 and positioned distribute the purge gas about the periphery of the substrate support 214 to prevent undesirable deposition on edges of the substrate support 214, the gas distribution showerhead assembly 204, and other components of the chamber 102, which result in particle formation and, ultimately contamination of the substrates 240. The purge gas flows downwardly into multiple exhaust ports 209, which are disposed around an annular exhaust channel 205. An exhaust conduit 206 connects the annular exhaust channel 205 to a vacuum system, which includes a vacuum pump 207. The pressure of the chamber 102 may be controlled using a valve system, which controls the rate at which the exhaust gases are drawn from the annular exhaust channel 205.

In other embodiments, purge gas tubes 283 (only one is shown) are disposed about the circumference of the chamber body 202 near the bottom of the chamber body 202. In this configuration, the purge gas enters the lower volume 210 of the chamber 102 and flows upwardly past the substrate support 214 and exhaust ring 220 and into the multiple exhaust ports 209 disposed about the circumference of the chamber body 202.

The chemical delivery module 203 delivers chemicals to the CVD chamber 102. Reactive gases (e.g., first and second precursor gases), carrier gases, purge gases, and cleaning gases may be supplied from the chemical delivery system through supply lines and into the chamber 102. In one embodiment, the gases are supplied through supply lines and into a gas mixing box where they are mixed together and delivered to the gas distribution showerhead assembly 204.

The remote plasma system 226 can produce a plasma for selected applications, such as chamber cleaning or etching residue from a processed substrate. Plasma species produced in the remote plasma system 226 from precursors delivered by an input line are flowed through a conduit 204D for dispersion through the showerhead assembly 204 to the CVD chamber 102. Precursor gases for a cleaning application may include chlorine containing gases, fluorine containing gases, iodine containing gases, bromine containing gases, nitrogen containing gases, and/or other reactive elements. The remote plasma system 226 may also be adapted to deposit CVD layers flowing appropriate deposition precursor gases into remote plasma system 226 during a layer deposition process. In one embodiment, the remote plasma system 226 is used to deliver active chlorine species to the processing volume 208 for cleaning the interior of the CVD chamber 102.

The temperature of the walls of the CVD chamber 102 and surrounding structures, such as the exhaust passageway, may be further controlled by circulating a thermal control liquid through channels (not shown) in the walls of the chamber 102. The thermal control liquid can be used to heat or cool the chamber body 202 depending on the desired effect. For example, hot liquid may help maintain an even thermal gradient during a thermal deposition process, whereas a cool liquid may be used to remove heat from the system during an in-situ plasma process for dissociation of a cleaning gas, or to limit formation of deposition products on the walls of the chamber. The heating provided by the lamps 221A, 221B, as well as the heating or cooling provided by the thermal control fluid from the heat exchanging system 270 through the gas distribution showerhead assembly 204 and/or the heating or cooling by delivering thermal control liquid to the walls of the chamber body 202 maintains a processing temperature in the processing volume 208 of about 500° C. to about 1300° C., more specifically, about 700° C. to about 1300° C. In one embodiment, the input power to the lamps 221A and 221B is about 45 kW to about 90 kW to produce a processing temperature between about 900° C. and about 1,050° C. in the processing volume 208 of the chamber 102. In one embodiment, the processing temperature is monitored by utilizing sensors, such as one or more thermocouples, that measure the temperature of the backside of the substrate carrier plate 112 (FIG. 1).

The third wall 278 of the gas distribution showerhead assembly 204 includes a surface 289 facing the substrate support 214. The temperature of the surface 289, as well as other portions of the gas distribution showerhead assembly 204, are monitored and controlled during processing. In one aspect, the gas distribution showerhead assembly 204 is fabricated from stainless steel and the surface 289 is bare stainless steel having a coefficient of emissivity of about 0.17. Temperature in the processing volume 208 is affected by the temperature of the surface and other surfaces of the chamber 102 surrounding the processing volume 208.

As process temperature in CVD deposition processes can affect film formation rate and film properties, the emissivity of the chamber components can be critical. Deposition of materials on component surfaces, or oxidation or corrosion thereof, cause changes in emissivity of the chamber components, which affects the temperature of the processing volume 208, and thus the temperature of the substrates 240, which may rest in an indentation 212 formed in the substrate support 214, which affects film formation and film properties on the substrates 240. The interior of the chamber is periodically cleaned in-situ or by opening the chamber in an attempt to restore the surfaces to an original pre-process condition. For example, during processing cycles, the emissivity of the surface 289 may change due to adhesion of precursor materials to the surface 289, and/or oxidation or corrosion of the surface 289. Adhesion of the precursor materials to, or corrosion or oxidation of, the surface 289 lowers the reflectivity of the surface 289. The lowered reflectivity causes process drift as the gas distribution showerhead assembly 204 absorbs more heat and affects the temperature in the processing volume 208. In one aspect, the change in temperature requires adjustment of the power applied to the lamps 221A, 221B and/or adjustment of the temperature of the thermal control fluid in the heat exchanging system 270 to maintain the desired temperature in the processing volume 208. Thus, precursor residue will continue to build up on these surfaces and requires power and/or thermal control fluid temperature adjustments to be made for successive deposition cycles. Essentially, the chamber controls must maintain the substrate temperature at a desired set-point, by varying heat into and out of the chamber as the gas distribution showerhead assembly surface properties change. Additionally, at a certain point, changes in fluid and lamp power is an impractical way to manage drift, and the chamber components must be cleaned or exchanged for new components.

While in-situ cleaning of these surfaces may be performed between process-runs to mitigate the process drift, the removal of deposition residue and/or oxidation or corrosion from the exposed surfaces will eventually require opening of the chamber 102 to physically clean the exposed surfaces. Removing and physically cleaning the chamber 102 is time consuming, and renders the chamber unavailable for use until the chamber is pumped down and baked out for continued processing. Additionally, although the chamber components may be cleaned in-situ, this takes the chamber "off-line" during the in-situ cleaning.

To address the issue of surface property drift in the chamber components, in one embodiment, the surface 289 of the gas distribution showerhead assembly 204 facing the substrate support 214 includes a roughened surface to increase the emissivity of the surface 289. In one embodiment, the surface 289 is bead blasted to provide a roughened surface having an average surface roughness (Ra) of about 80 micro inch (µ-inch) to about 120 µ-inch. The roughening of the surface 289 increases the initial emissivity of the surface 289, as compared to non-roughened surfaces, and reduces the emissivity change caused by corrosion or oxidation, which reduces process drift. In one embodiment, a #80 grit size is utilized to provide the roughened surface. The bead blasting may be applied at a pressure known to create the desired Ra using a desired grit size. In one aspect, the beads are allowed to enter any openings in the surface 289. In one aspect, the diameters of any openings in the gas distribution showerhead assembly 204 are greater than the grit size, and in particular, greater than the dimension of #80 grit size. The openings may be cleaned by coupling the gas distribution showerhead assembly 204 to a vacuum pump or disposing the gas distribution showerhead assembly 204 in a vacuum environment to remove and exhaust any grit that may have entered the openings in the gas distribution showerhead assembly 204. In another aspect, a purge gas may be delivered through the openings in the gas distribution showerhead assembly 204 at a pressure of about 80 psi to prevent or minimize any beads or grit from entering the openings.

In another embodiment, the surface 289 of the gas distribution showerhead assembly 204 facing the substrate support 214 includes a coating 291. Additionally, other surfaces of the chamber 102 in proximity to the processing volume 208, such as interior surfaces 295 of the chamber body 202, may include a coating 296. In one embodiment, the gas distribution showerhead assembly 204 and the chamber body 202 comprise a stainless steel material, such as 316L stainless steel. The coatings 291, 296 comprise a material that is compatible with process chemistry used in deposition and cleaning processes. The coatings 291, 296 are compatible with the extreme temperature applications utilized in MOCVD and HVPE processes. The coatings 291, 296 maximize the emissivity and stabilize the emissivity of the surfaces 289 and/or 295 and the base material thereof, in order to stabilize thermal absorption of the base material. In one embodiment, the coatings 291, 296 comprise a coefficient of emissivity of about 0.8 to about 0.85.

The coatings 291, 296 may comprise a ceramic material that is deposited on the surfaces 289, 295. It has been found that, when such coatings are applied to a metal surface, such as stainless steel, the emissivity of the surface of the components, after deposition and cleaning processes, is significantly closer to the emissivity of the component surface before use. In one aspect, the coating 291 includes alumina or aluminum oxide ($Al_2O_3$), zirconium oxide ($ZrO_2$), yttrium (Y), yttrium oxide ($Y_2O_3$), chromium oxide ($Cr_2O_3$), silicon carbide (SiC), combinations thereof or derivatives thereof. The coatings 291, 296 may be deposited on the respective surfaces utilizing a thermal spraying method, such as plasma spraying. The coatings 291, 296 formed on the surfaces 289, 295 may have a thickness between about 50 microns (µm) to about 200 µm. The coatings 291, 296 may be porous. In one embodiment, the coatings 291, 296 include a porosity of less than about 10%, such as about 0.5% to about 10%, for example, about 8% to about 10% utilizing an optical method. In another embodiment, the coatings 291, 296 include a porosity of less than 15%, such as about 0.5% to about 15%, for example, between about 10% to about 15%, utilizing the Archimedes method. The coatings 291, 296 may be hydrophilic or wettable and include a contact angle of less than about 90°, such as between 0° and 90°. The coatings 291, 296 may be a white color after plasma spraying and remain substantially white in color even after several deposition and/or cleaning cycles. Further, the emissivity is substantially stable between the first use and a cleaning process. For example, the emissivity may be about 0.8 at the first use and about 0.81 prior to in-situ cleaning. Thus, the emissivity delta of the coatings 291, 296 are between about 0.8 to about 0.85, which provides negligible drift in power applied to the lamps 221A, 221B, which, in one embodiment, is less than about 100 Watts at a power set-point of about 80,000 Watts, which is used to provide a temperature of about 1,000° C. in the processing volume 208 and/or a substrate temperature of about 1,000° C.

The plasma spray process is performed ex-situ at atmospheric pressure to form the coatings 291, 296. The plasma spray process includes preparation of the surfaces 289, 295 to increase adhesion of the coatings 291 and 296. In one embodiment, the surfaces 289, 295 are bead blasted to create a roughened surface to promote adhesion of the coatings 291, 296. In one aspect, the beads are #80 grit size aluminum oxide particles utilized to form a roughened surface with an Ra of about 80 micro inch (μ-inch) to about 120 μ-inch. A purge gas may be delivered through the gas distribution showerhead assembly 204 during bead blasting to prevent any particles from entering any openings formed on the surface 289. In one embodiment, a plasma spray consisting of a ceramic powder may be deposited on the surfaces 289, 295 after roughening. In one embodiment, the ceramic powder is 99.5% pure. In another embodiment, the ceramic powder is aluminum oxide ($Al_2O_3$). The plasma spray may be applied at a pressure to create the desired Ra using a desired powder size. In one aspect, a plasma of the ceramic powder is applied to the surfaces 289, 295 and any openings in the surfaces 289, 295 are covered or filled to prevent clogging. In another aspect, the plasma of the ceramic powder is allowed to at least partially enter any openings in the surfaces 289, 295. In one embodiment, a purge gas is delivered through the gas distribution showerhead assembly 204 during plasma spraying at a pressure of about 80 psi that prevents spray from entering any openings formed on the surface 289. In one aspect, the plasma spray is applied to the surface 289 such that any openings in the surface 289 are lengthened by an amount equal to the thickness of the coating 291 on the surface 289. In another embodiment, the purge gas is delivered through the gas distribution showerhead assembly 204 at a pressure less than about 80 psi that allows a portion of the spray to enter openings formed on the surface 289. In yet another embodiment, the plasma spray is allowed to cover the openings. In this embodiment, the openings may be re-machined to be reopened and sized after application of the coating, if desired.

The coatings 291, 296 may also be removed so that the base material of the surfaces 289 and 295 may be refurbished. The coatings 291, 296 may be removed by bead blasting or utilizing chemicals to attack the interface between the surfaces 289 and 295 and break the bond between the coating and the base material. After the surfaces 289, 295 are cleaned, the coatings 291, 296 may be reapplied to the cleaned surfaces 289 and 295 according to the coating process described above and re-installed into the chamber 102.

Figure 3:
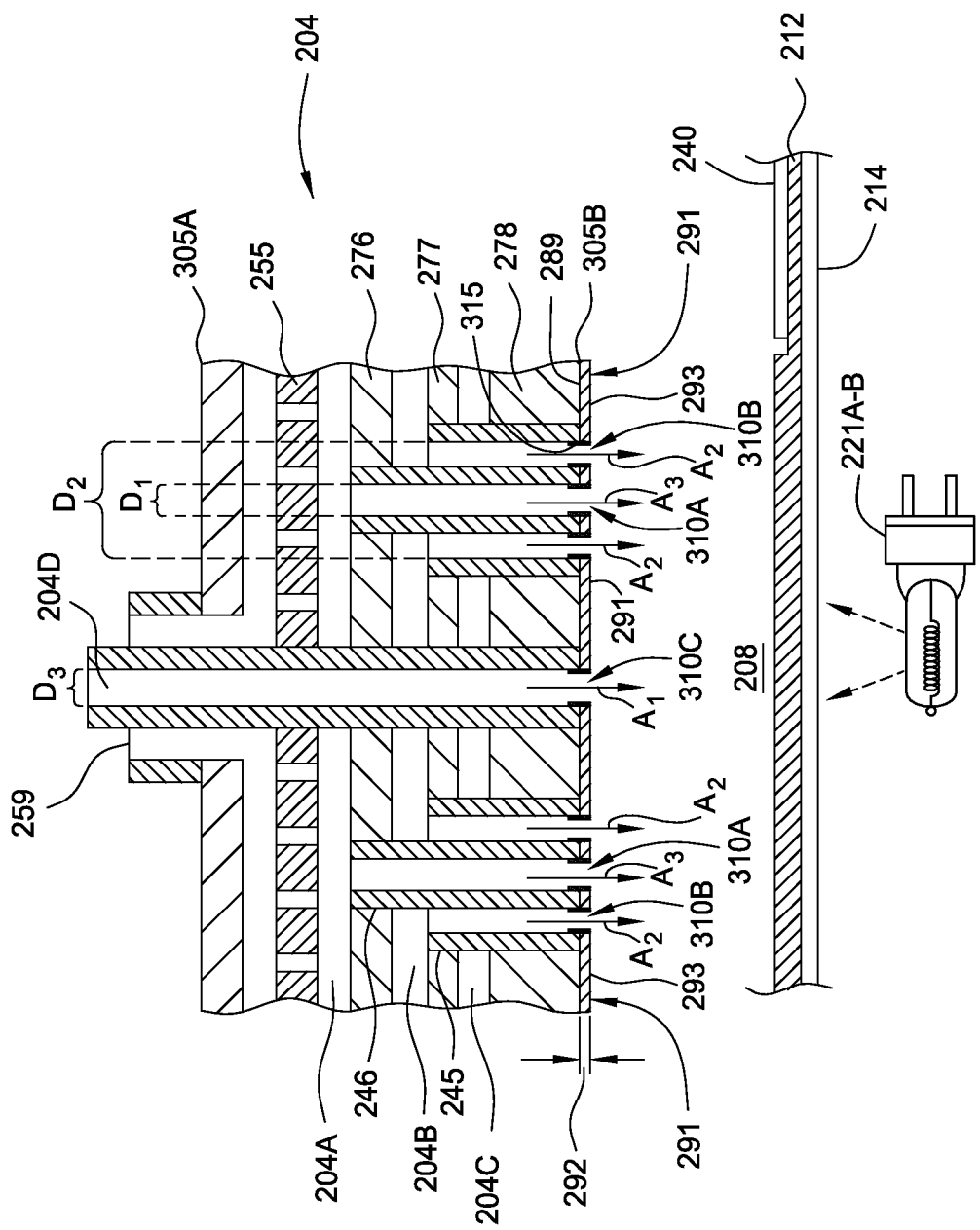
FIG. 3 is an enlarged view of detail A shown in FIG. 2.

FIG. 3 is an enlarged view of detail A shown in FIG. 2, further showing a distribution of the coating 291 on the gas distribution showerhead assembly 204. The gas distribution showerhead assembly 204 comprises a body having a first major side 305A and a second major side 305B that has a surface 293. Referring to FIGS. 2 and 3, in one embodiment, the first precursor or first processing gas mixture, such as a metal organic precursor, is delivered from the first processing gas plenum 204A through the second processing gas plenum 204B and the temperature control plenum 204C into the processing volume 208 by a plurality of inner gas conduits 246. The inner gas conduits 246 may be cylindrical tubes made of stainless steel located within aligned holes disposed through the first plenum wall 276, the second plenum wall 277, and the third wall 278 of the gas distribution showerhead assembly 204. Each of the inner gas conduits 246 include an opening 310A in the second major side 305B. Each opening 310A is formed through the surface 289 to deliver the first precursor along a flow path $A_3$ to the processing volume 208. In one embodiment, the inner gas conduits 246 are each attached to the first plenum wall 276 of the gas distribution showerhead assembly 204 by suitable means, such as brazing.

In one embodiment, the second precursor or second processing gas mixture, such as a nitrogen precursor, is delivered from the second processing gas plenum 204B through the temperature control plenum 204C and into the processing volume 208 through a plurality of outer gas conduits 245. The outer gas conduits 245 may be cylindrical tubes made of stainless steel. Each of the outer gas conduits 245 may be located concentrically about a respective inner gas conduit 246. Each of the outer gas conduits 245 include an opening 310B in the second major side 305B. Each opening 310B is formed through the surface 289 to deliver the second precursor along a flow path $A_2$ to the processing volume 208. The outer gas conduits 245 are located within the aligned holes disposed through the second plenum wall 277 and the third plenum wall 278 of the gas distribution showerhead assembly 204. In one embodiment, the outer gas conduits 245 are each attached to the second plenum wall 277 of the gas distribution showerhead assembly 204 by suitable means, such as brazing. Plasma species produced in the remote plasma system 226 from precursors delivered by an input line are flowed through a conduit 204D for dispersion through the gas distribution showerhead assembly 204 to the processing volume 208 through an opening 310C formed through the surface 289.

In one embodiment, each of the openings 310A-310C include a diameter, such as an inside diameter $D_1$-$D_3$ and the coating 291 is applied to the surface 289 in a manner that lengthens the openings 310A-310C without a reduction in the diameters $D_1$-$D_3$. In one embodiment, the inside diameters $D_1$-$D_3$ are about 0.6 mm. In one aspect, the openings 310A-310C are lengthened in an amount equal to the thickness of the coating 291 without any reduction in the diameters $D_1$-$D_3$. In another embodiment, the coating 291 is allowed to at least partially cover a portion of the openings 310A-310C and enter the inside diameters $D_1$-$D_3$, shown as interior coating 315 In this embodiment, the openings 310A-310C are not covered or filled prior to plasma spraying. Thus, the coating 291 is allowed to reduce the size of the openings 310A-310C. In one embodiment, the thickness 292 of the coating is about 50 μm to about 200 μm on the surface 289 and the inside diameters $D_1$-$D_3$. In one aspect, the thickness 292 is chosen to correspond with the amount of open area percentage of each opening 310A-310C. In one example, the thickness 292 of the coating 291 is chosen to cover a portion of each opening 310A-310C leaving at least about greater than 80% of the opening diameter $D_1$-$D_3$. In one embodiment, the coating 291 is allowed to enter the openings 310A-310C to a depth of about 50 μm to about 200 μm from the surface 289. The orifice 284 (FIG. 2) is not shown and may be at least partially covered by the coating 291 as described above in reference to openings 310A-310C.

Figure 4:
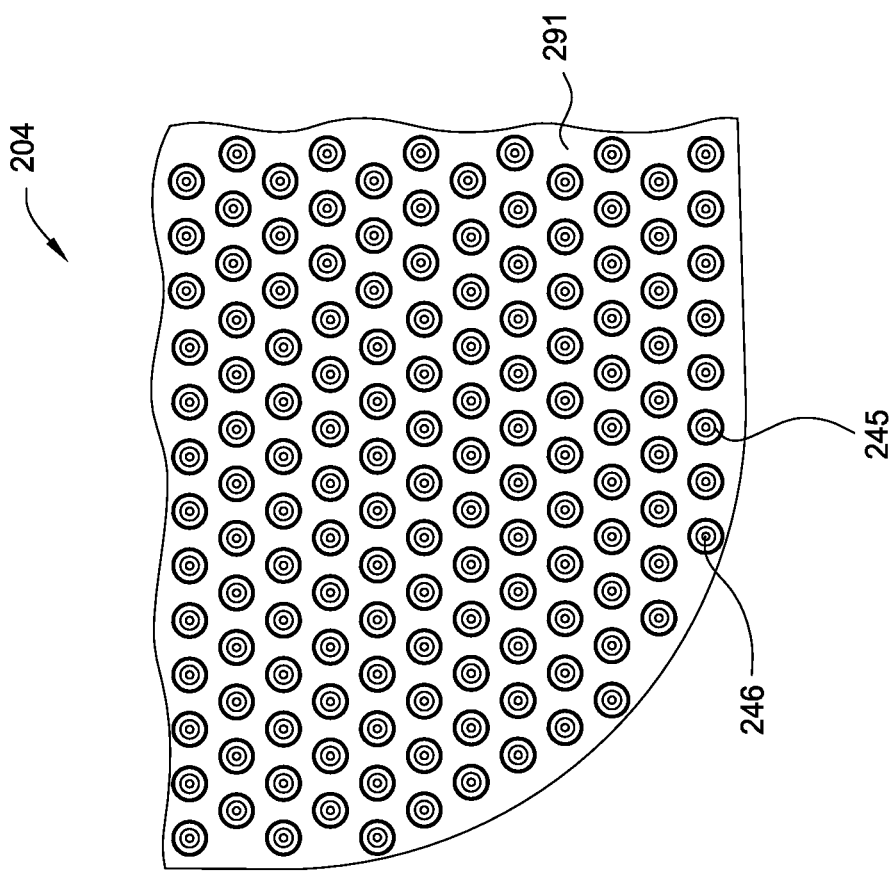
FIG. 4 is a partial, schematic, bottom view of the showerhead assembly from FIG. 2 and according to one embodiment of the present invention.

FIG. 4 is a partial, schematic, bottom view of the showerhead assembly 204 from FIG. 2 and according to one embodiment of the present invention. As depicted, the concentric tube configuration comprising the outer gas conduit 245 that delivers a second gas from the second processing gas plenum 204B and the inner gas conduit 246 that delivers a first gas from the first processing gas plenum 204A are arranged in a much closer and more uniform pattern. In one embodiment, the concentric tubes are configured in a hexagonal close packed arrangement. As a result, each of the first and second processing gases, delivered from the first processing gas plenum 204A and the second processing gas plenum 204B, is delivered more evenly across the substrates 240 positioned in the processing volume 208, resulting in significantly more deposition uniformity.

In summary, embodiments of the present invention include a gas distribution showerhead assembly 204 having concentric tube assemblies for separately delivering processing gases into a processing volume 208 of a processing chamber 102. The gas distribution showerhead assembly 204, as well as other portions of the chamber 102, may include a high emissivity coating 291, 296 disposed thereon to reduce emissivity variations of the components in proximity to the processing volume 208 and thus minimizes temperature changes in the processing volume 208. The temperature of the processing volume 208 and other deposition parameters, such as heat applied to the gas distribution showerhead assembly 204 from a heat exchange system 270 and/or lamps 221A, 221B, may be more readily maintained according to embodiments described herein. Thus, power levels applied to the lamps 221A, 221B, as well as the temperature of thermal control fluid to the gas distribution showerhead assembly 204 may be readily maintained. This improves wafer-to-wafer repeatability without the need to adjust process parameters.

It is believed that by use of the coating 291, the temperature of the processes performed in the processing volume 208 of an LED processing chamber, such as the processing chamber 102, can be maintained more readily as compared to more conventional process chamber designs. The coated chamber components, which reduce emissivity variations, generally leads to an improvement in wafer-to-wafer and within-wafer temperature uniformity results, and thus leads to an improved LED device performance repeatability. By use of the gas distribution showerhead assembly 204 as described herein, it has been found that the thermal energy provided to the substrates by the substrate heating source(s), such as lamps 221A, 221B, remain in a relatively small range, such as a change in power applied to the heating source(s) of about less than about 0.5%, for example, between about 0.5% to less than about 0.2%, such as less than about 0.12% to maintain a desired set-point temperature. For instance, to maintain a set-point temperature of about 1,000° C., the power applied to the substrate heating source(s) varies by less than 100 Watts. In one example, to maintain a temperature set-point of about 1,000° C., the thermal energy provided to the substrates by the substrate heating source(s) varies by less than 100 Watts, which is used to achieve a substrate processing temperature. In another example, to maintain a power set-point of about 80,000 Watts, the thermal energy provided to the substrates by the substrate heating source(s) varies by less than 100 Watts, which is used to achieve a substrate processing temperature of about 1,000° C. Changes in power applied to the lamps 221A, 221B, and/or changes in the temperature or flow rate of thermal control fluid to compensate for emissivity drift is greatly reduced, according to embodiments described herein.

In one embodiment, the substrate carrier plate 112 (FIG. 1) utilized during processing comprises a surface area of about 95,000 mm$^2$ to about 103,000 mm$^2$, such as about 100,000 mm$^2$, and the input power to the lamps 221A and 221B may be varied based on this area to achieve a set-point processing temperature. In one embodiment, an input power to the lamps 221A and 221B is about 45 kW to achieve a processing temperature of about 900° C. measured at the backside of the substrate carrier plate 112. In another embodiment, an input power to the lamps 221A and 221B is about 90 kW to achieve a processing temperature of about 1,050° C. measured at the backside of the substrate carrier plate 112. Thus, a power density of input power to the lamps 221A and 221B may be about 0.45 W/mm$^2$ to about 0.9 W/mm$^2$ based on the surface area of the substrate carrier plate 112.

In another embodiment, the gas distribution showerhead assembly 204 utilized during processing comprises a surface area (of the surface 289) of about 100,000 mm$^2$ to about 250,000 mm$^2$, such as about 200,000 mm$^2$, and the input power to the lamps 221A and 221B may be varied based on this area to achieve a set-point processing temperature. In one embodiment, an input power to the lamps 221A and 221B is about 45 kW to achieve a processing temperature of about 900° C. measured at the backside of the substrate carrier plate 112. In another embodiment, an input power to the lamps 221A and 221B is about 90 kW to achieve a processing temperature of about 1,050° C. measured at the backside of the substrate carrier plate 112. Thus, a power density of input power to the lamps 221A and 221B may be about 0.225 W/mm$^2$ to about 0.45 W/mm$^2$ based on the surface area of the gas distribution showerhead assembly 204.

In one example, data from sixteen deposition process cycles was acquired and the power delivered to the lamps 221A, 221B over the sixteen deposition and cleaning cycles remained substantially stable. In this example, a 100 Watt drift at a lamp output power of about 80,000 Watts for a coated showerhead was measured, as compared to an 8,000 Watt drift in lamp power at the same output power set-point for an uncoated showerhead. The coating 291 thus provided an 80× improvement in thermal control of the processing environment in which the substrates are placed over the sixteen deposition process cycles. In this example, the temperature of the thermal control fluid delivered through the heat exchange system 270 and temperature control plenum 204C was monitored during deposition and cleaning processes to determine the variation in heat taken out of the gas distribution showerhead assembly 204. The energy removed from the gas distribution showerhead assembly 204 through the coating 291 was about 15.3 kW during deposition. It has been found, and one skilled in the art will appreciate, that the LED device yield will significantly vary if the substrate(s) processing temperature drifts more than a few degrees (e.g., +/−2.5° C.) from process-run to process-run. The LED device yield issue arises, at least in part, due to the variability in light output created in the formed LED devices from process-run to process-run. Therefore, embodiments described herein prevent or minimize run-to-run substrate processing temperature variation or drift within an acceptable range to repeatably produce an LED device having substantially the same film thickness and light output. It has been found that by use of the coating 291 described above, the run-to-run average substrate processing temperature range is less than about +/−2° C. at a processing temperature of a desired set-point temperature at a point between 800° C. and 1,300° C., such as about 1,000° C., which minimizes process-run to process-run and within-wafer film thickness variations to produce an LED device with substantially the same light output characteristics.

Testing of a gas distribution showerhead assembly 204 having a coating 291 thereon showed an increase between cleaning intervals and an increase in the number of process-runs before film thickness drifted out of specification. For example, a gas distribution showerhead assembly 204 having a coating 291 thereon was utilized for 80 process-runs while maintaining film thickness per specification as compared to a gas distribution showerhead without a coating where film thickness drifted out of specification after 10 process-runs.

Therefore, in one aspect, the gas distribution showerhead assembly 204 having a coating 291 thereon as described herein increased the number of process-runs to about 80 before in-situ cleaning as compared to about 10 utilizing a showerhead without a coating. Thus, the gas distribution showerhead assembly 204 as described herein increases throughput by minimizing downtime of the chamber. Testing of a gas distribution showerhead assembly 204 having a coating 291 thereon also showed a temperature decrease in the surface of the substrate support 214 of about 40° C. The temperature decrease was due to the higher coefficient of emissivity of the coating 291 on the gas distribution showerhead assembly 204. Thus, greater heat loss to the substrate support 214 results in a lower temperature for the gas distribution showerhead assembly 204 utilizing the same power input to the lamps 221A, 221B.

During a deposition process, material may deposit not only on the substrate, but also on other chamber components. In a MOCVD chamber, one of those components is the gas distribution showerhead. The showerhead may be cleaned by bombarding the showerhead with radicals generated by a plasma that includes an inert gas and chlorine. In order to generate the plasma, the showerhead may be negatively biased or floating relative to the substrate support. The showerhead may comprise stainless steel and be coated with a ceramic coating.

One method that may be employed to clean the showerhead is to ignite a plasma remotely from the chamber and deliver the radicals/ions to the chamber. Chlorine based gases may be effective to clean the showerhead. A high chlorine partial pressure may be utilized to improve the chlorination reaction efficiency. However, a high pressure process suppresses the sublimation rates of chlorinated reaction byproducts formed on showerhead surfaces. The cleaning efficiency of thermal diatomic chlorine cleaning processes may be compromised. To improve the efficiency of in-situ chamber cleaning utilizing diatomic chlorine, it may be desirable to employ a much more chemically reactive species such as chlorine radicals for chlorination reaction at a reduced process pressure to facilitate reaction byproduct sublimitation process. Hence, remotely generated plasma may be an option.

In order to perform remotely generated plasma cleaning of the showerhead, the radicals/ions generated remotely may be generated by a remote plasma source. In one embodiment, the radicals/ions may be formed by chlorine discharge to generate chlorine radicals and ions. The remote plasma source may be an inductively coupled plasma source that may be powered by RF or microwave power. Alternatively, the remote plasma source may comprise an electron cyclotron resonance (ECR) plasma source that may be powered by RF or microwave power.

The source gas for the remote plasma source may comprise diatomic chlorine. However, other chlorine based gases may be utilized effectively as well such as ICl, HCl, $BCl_3$, $CCl_4$ and $CH_3Cl$. The remote plasma source may be mounted directly on top of the chamber lad to reduce the path length to the reactor and the downstream of the remote plasma source may be designed with minimized flow restrictions to reduce recombination effects. An inert gas, such as argon or helium may be introduced to ignite the plasma and/or to mix with the diatomic chlorine (when utilized) in glow discharge to increase the plasma density. The chamber pressure may be reduced from the deposition pressure to less than about 5 Torr to minimize the recombinations effects. An agitator maybe used during the cleaning process to improve the distribution of the reactive species. The ceramic coating on the showerhead may be highly chlorine resistive and or poor thermal conductivity to increase the showerhead surface temperature which will increase chlorination and sublimation rates. The ceramic will protect the stainless steel from corrosion by the chlorine radicals. To enhance the cleaning efficiency, UV sources, such as Hg—Xe lamps or KrF excimer lasers may be used for photodissociation of chlorine-containing compounds that are introduced to the chamber.

Figure 5:
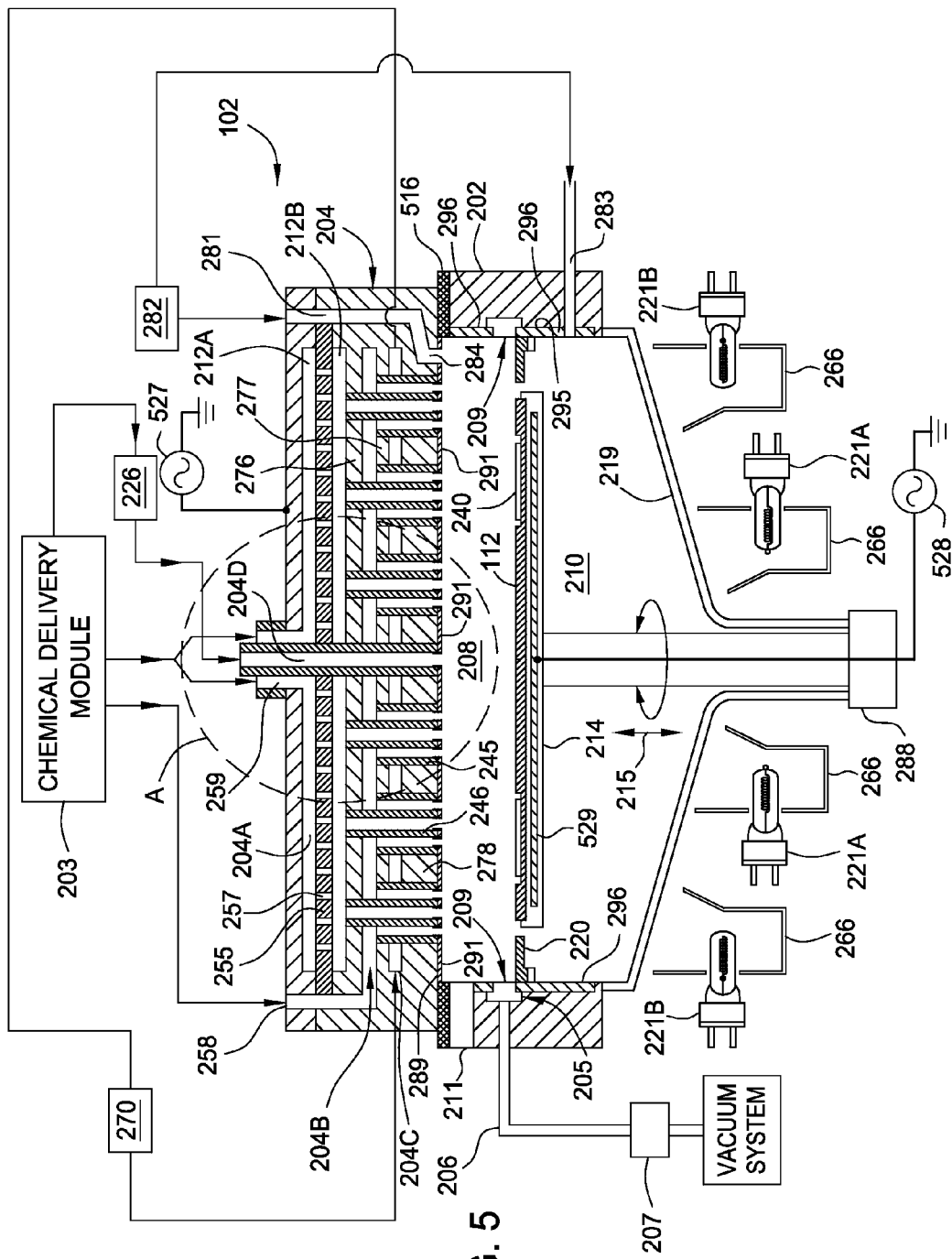
FIG. 5 is a schematic cross sectional view of an apparatus according to one embodiment.

As an alternative to remotely generated plasma cleaning of the showerhead, the showerhead may be bombarded with radicals/ions by generating a plasma within the processing chamber in-situ. FIG. 5 shows CVD chamber 102 that has been modified to permit in-situ cleaning of the showerhead assembly 204. For simplicity, a power source 527 is shown coupled to the showerhead assembly 204 and a power source 528 is shown coupled to an electrode 529 embedded within the substrate support 214. It is to be understood that in operation, either the showerhead assembly 204 or the substrate support 214 would be powered while the other would be grounded or even electrically floating. The chamber body 202 may be grounded as well. Because either the showerhead assembly 204 or the substrate support 214 is biased relative to the other during the showerhead cleaning process, the showerhead assembly 204 is electrically isolated from the chamber body 202 by an electrically insulating material 516. Thus, the showerhead assembly 204 may be cleaned by a capacitively coupled plasma process.

Figure 6A:
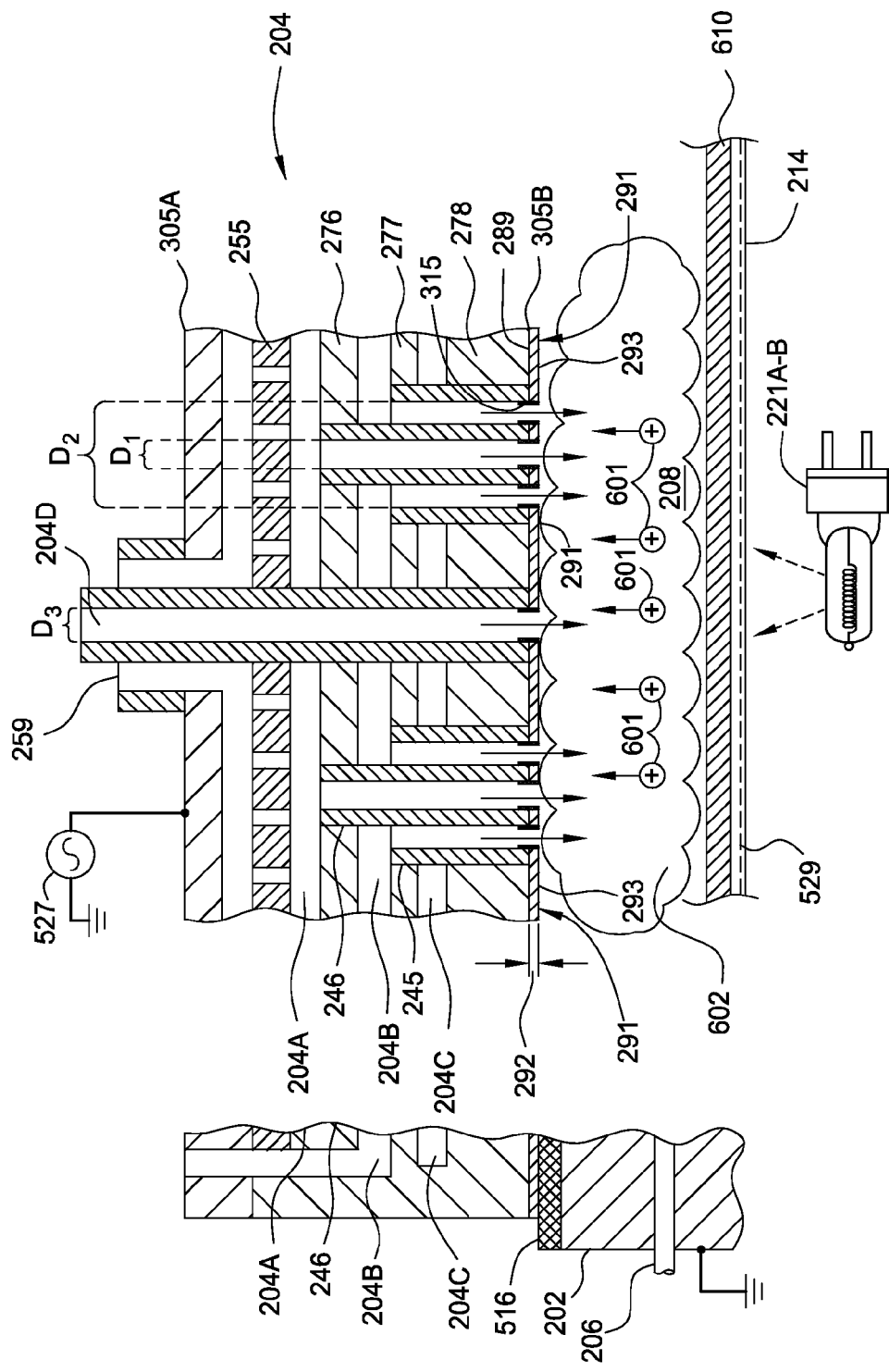
FIG. 6A is a schematic close-up view of the apparatus during a cleaning process according to one embodiment.

In order to attract the radicals/ions to the showerhead assembly 204 for cleaning, the showerhead assembly 204 may be negatively biased to attract the positive ions to the showerhead assembly 204 to bombard the showerhead assembly 204. FIG. 6A shows the embodiment whereby the showerhead assembly 204 is negatively biased while the chamber body 202 is grounded as is the substrate support 214. The showerhead assembly 204 is negatively biased with power supply 527. In the embodiment shown in FIG. 6A, the power supply is an RF power supply. It is to be understood that because the showerhead assembly 204 contains stainless steel, power supplies such as DC and AC may be used, but may not be as effective as RF due to the presence of the ceramic coating over the stainless steel.

The showerhead assembly 204 is cleaned by introducing a cleaning gas to the chamber 102. The cleaning gas may comprise diatomic chlorine. However, other chlorine based gases may be utilized effectively as well such as ICl, HCl, $BCl_3$, $CCl_4$ and $CH_3Cl$. During the cleaning, the showerhead assembly 204 and the substrate support 214 should be fairly close, such as less than one inch spacing therebetween. The pressure of the chamber 102 should be kept low such as about 300 mTorr and below. The temperature of the cleaning may be around room temperature because the showerhead assembly 204 is generally cooled during the deposition process. During the cleaning process, the showerhead assembly 204 is not actively cooled or heated. The heat from the plasma 602 that is ignited within the chamber 102 heats the showerhead assembly 204. However, because the showerhead assembly 204 is coated with a ceramic coating, the ceramic coating provides a thermal barrier to the stainless steel and therefore, the surface temperature of the ceramic may increase due to the plasma 602. The cleaning gas introduced may have a flow rate of up to about 100 sccm, which aids in maintaining a low pressure. The low pressure permits the chamber to be operated with a simple vacuum pump rather than a turbomolecular pump. To maintain the low pressure, inert gas or carrier gases may be avoided because additional gases will cause an increase in pressure. However, if a turbomolecular pump is used, then a higher pressure may be used in the chamber and inert or carrier gases may be supplied in addition to the chlorine containing gas. The power density for the RF bias to the showerhead assembly 204 may be between about 2.23 W/in$^2$ to about 16 W/in$^2$. A metal plate 610 may be positioned on the substrate support 214 to provide a grounded electrode in opposition to the biased showerhead assembly 204.

When the showerhead assembly 204 is biased, the cleaning operation would proceed as follows. The substrate support 214 and showerhead assembly 204 would be placed into a position where they are spaced apart by less than about one inch if they are not already in the cleaning position. Cleaning gas would be introduced to the area between the substrate support 214 and the showerhead assembly 204. The bias would be applied to the showerhead assembly 204 and the plasma 602 would be generated. Ions 601 from the plasma would be attracted towards the showerhead assembly 204 and any deposits would be removed from the ceramic surface of the showerhead assembly 204. Then the showerhead assembly 204 is ready to resume operations for depositing material onto substrates. Thus, the entire process proceeds as follows. One or more substrates are processed within the chamber 102 by introducing a metal organic precursor as discussed above and cases to react therewith and deposit on the one or more substrates by a MOCVD process. During the deposition process, the emissivity of the ceramic coating on the showerhead assembly 204 changes from a first emissivity level to a second emissivity level. The processing chamber may then be cleaned by a thermal cleaning process. The showerhead assembly 204 is cleaned by a plasma process such that the ceramic coating exposed to have a third emissivity level that is within 2 percent of the first emissivity level. Substrates are then processed again using the MOCVD process.

Figure 6B:
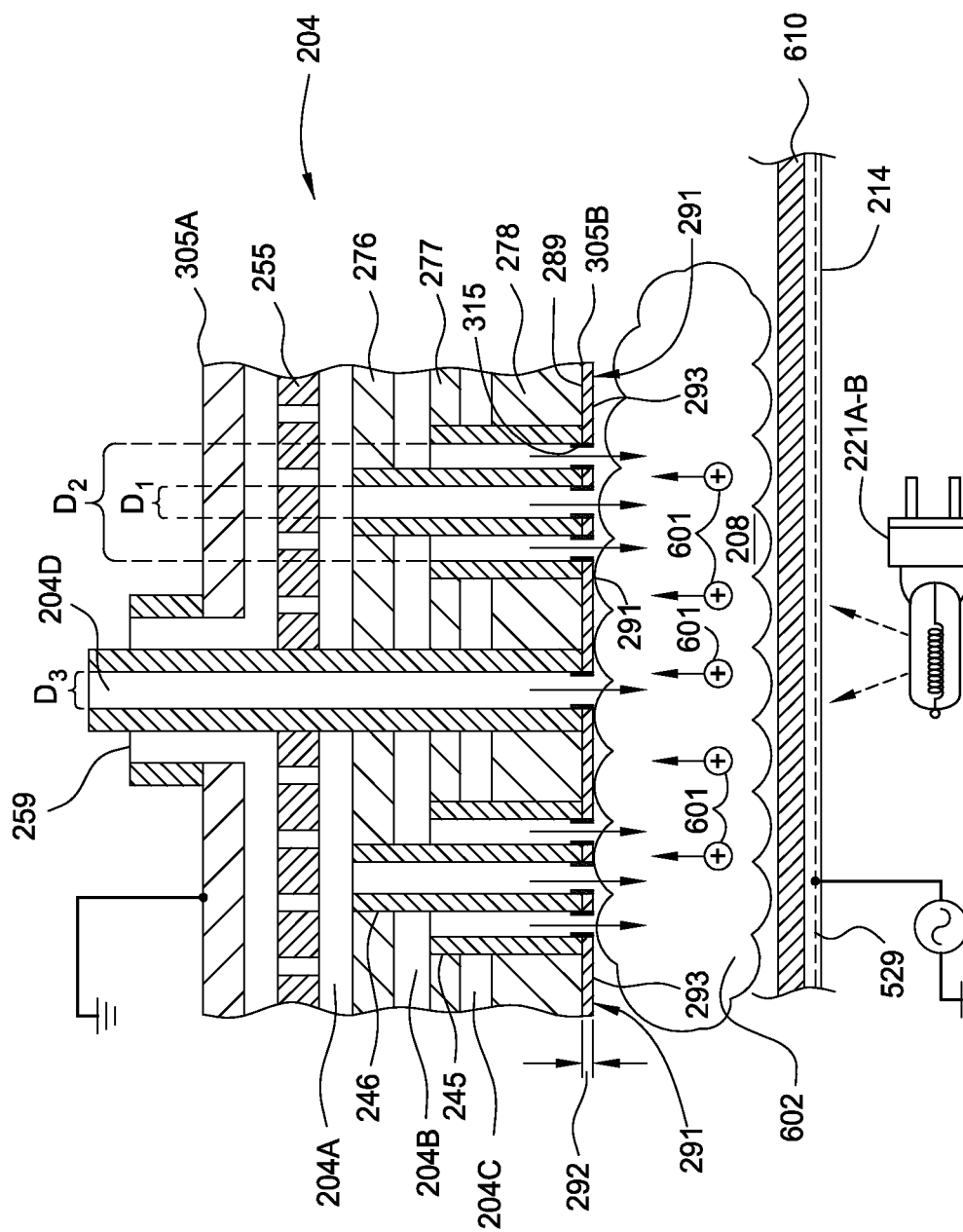
FIG. 6B is a schematic close-up view of the apparatus during a cleaning process according to another embodiment.

In another embodiment (shown in FIG. 6B), the showerhead assembly 204 may be grounded while the substrate support 214, having an electrode 529 therein, is positively RF biased from power source 528. The conductive plate 610 is present over the substrate support 214 to provide the electrode. The operation would proceed in the same manner as when the showerhead assembly 204 is biased, except that the substrate support 214 is biased. The positively biased substrate support 214 does not attract ions, but rather, repels ions so that the ions will be attracted to the grounded showerhead assembly 204. In either biasing situation (showerhead assembly 204 or substrate support 214), the ions bombard the showerhead assembly 204 and, in essence, perform a reactive ion etching (RIE) process to clean the showerhead assembly 204.

Figure 7:
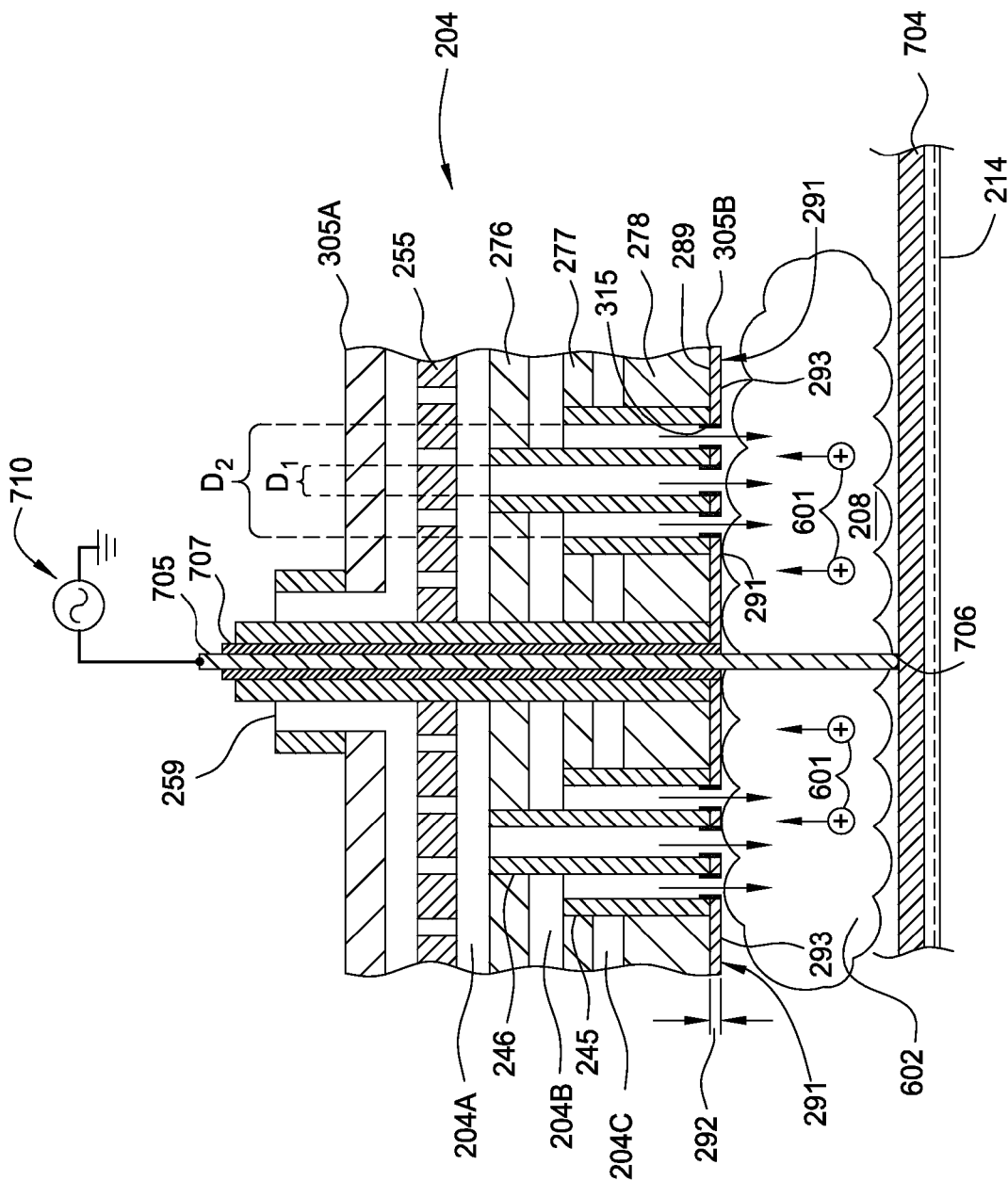
FIG. 7 is a schematic close-up view of the apparatus during a cleaning process according to another embodiment.

In another embodiment (shown in FIG. 7), the showerhead assembly 204 may be grounded while a conductive plate 704 that is placed on the substrate support 214 is positively biased by an electrical connection rod 705 that is inserted through the showerhead assembly 204 and placed into contact with the conductive plate 704 at location 706. The conductive rod 705 is electrically insulated from the showerhead assembly 204 by electrically insulating material 707. The rod 705 is coupled to an RF power source 710. Because the showerhead assembly 204 is grounded and the conductive plate 704 is biased, the ions would be repelled towards the showerhead assembly 204 to perform an RIE of the showerhead assembly 204.

Figure 8:
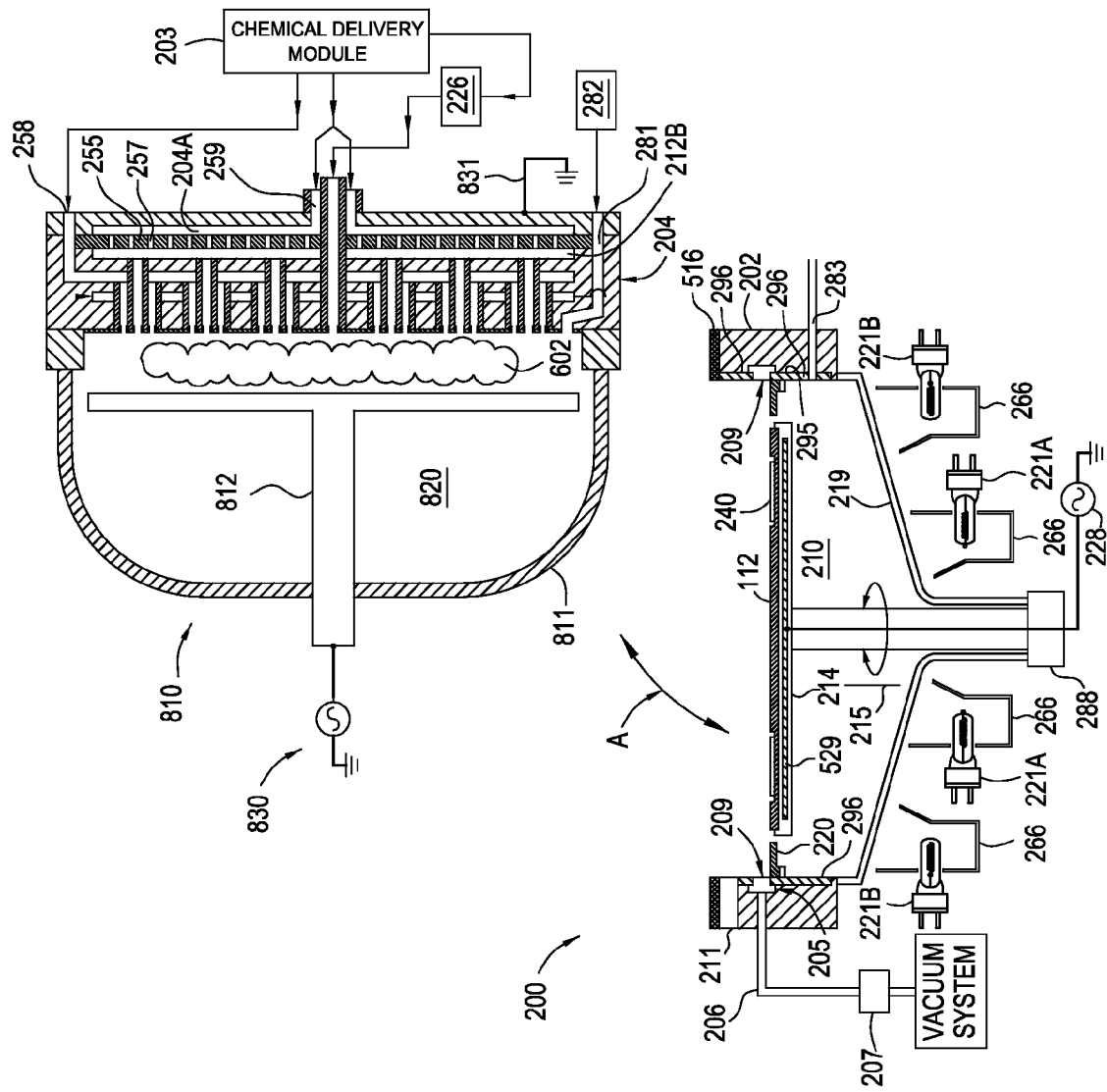
FIG. 8 is a schematic cross sectional view of an apparatus having a showerhead cleaning attachment according to one embodiment.

In each embodiment discussed above (i.e., FIGS. 6A, 6B and 7), the cleaning has been performed in-situ. In the embodiment shown in FIG. 8, the cleaning may be performed ex-situ. The entire showerhead assembly 204 may be pivoted up and out of contact from the lower assembly 200 as shown by arrow "A" which may be coupled to a power source 228. The showerhead assembly 204 is connected to a grounding line 831 while a cleaning assembly 810 is coupled to, but electrically insulated from, the showerhead assembly 204. The cleaning assembly 810 includes an RF power source 830, cleaning electrode 812, vacuum area 820, chamber walls 811, and a vacuum pump to evacuate the cleaning assembly 810 once coupled to the showerhead assembly 204. The cleaning gas is introduced to the area between the cleaning electrode 812 and the showerhead assembly 204. The electrode 812 is biased by power source 830 and the plasma 602 ignites. Ions from the plasma are attracted to the showerhead assembly 204 to clean the showerhead assembly 204. Once the cleaning process is complete, the showerhead assembly 204 is decoupled from the cleaning assembly 810 and re-attached to the processing chamber 102 to resume deposition operations.

It is to be understood that while the embodiments discussed above in regards to FIGS. 6A, 6B, 7 and 8 have discussed a biased electrode in opposite to a grounded electrode, the arrangement could have the biased electrode in opposite to a floating electrode rather than a grounded electrode.

By bombarding a ceramic coated stainless steel showerhead with ions from chlorine plasma, the emissivity of the showerhead may be returned to within 2 percent of the emissivity of a virgin showerhead that has not been used in a MOCVD process.

While the foregoing is directed to embodiments of the present invention, other and further embodiments of the invention may be devised without departing from the basic scope thereof, and the scope thereof is determined by the claims that follow.

The invention claimed is:

1. A method, comprising:
    introducing a cleaning gas to a processing chamber;
    applying an electrical bias to a gas distribution showerhead that is coupled to the processing chamber while a substrate support disposed opposite the showerhead is electrically floating or grounded, the showerhead having a showerhead body comprising stainless steel having a roughened surface with a ceramic coating thereover facing the substrate support, the ceramic coating deposited on the roughened surface while controlling deposition pressure to form a desired roughness, the showerhead body having a plurality of first gas passages and a plurality of second gas passages extending therethrough, the electrical bias igniting the cleaning gas into a plasma containing cleaning gas radicals and ions;
    reacting the cleaning gas radicals with deposits formed on the ceramic coating by bombarding the ceramic coating with the cleaning gas radicals to form a byproduct and expose the ceramic coating, the exposed ceramic coating having an emissivity within 2 percent of the emissivity of the ceramic coating prior to formation of the deposits thereon; and
    exhausting the byproduct from the processing chamber.

2. The method of claim 1, wherein the cleaning gas comprises a chlorine containing gas.

3. The method of claim 2, wherein the chlorine containing gas is selected from the group consisting of $Cl_2$, ICl, HCl, $BCl_3$, $CCl_4$, $CH_3Cl$ and combinations thereof.

4. The method of claim 3, wherein the electrical bias is a negative electrical bias.

5. The method of claim 4, wherein the pressure within the chamber during the cleaning is less than about 300 mTorr.

6. The method of claim 5, wherein the electrical bias is between about 2.23 W/in$^2$ to about 16 W/in$^2$.

7. A method, comprising:
    performing a deposition process on one or more substrates in a processing chamber while changing the emissivity of a gas distribution showerhead from a first emissivity level to a second emissivity level;
    removing the substrates from the processing chamber;

introducing a cleaning gas to a processing chamber;
applying an electrical bias to the gas distribution showerhead that is coupled to the processing chamber while a substrate support disposed opposite the showerhead is electrically floated or grounded, the showerhead having a showerhead body comprising stainless steel having a roughened surface and a ceramic coating thereover facing the substrate support, the ceramic coating deposited on the roughened surface while controlling deposition pressure to form a desired roughness, the showerhead body having a plurality of first gas passages and a plurality of second gas passages extending therethrough, the electrical bias igniting the cleaning gas into a plasma containing cleaning gas radicals and ions;
reacting the cleaning gas radicals with deposits formed on the ceramic coating by bombarding the ceramic coating with the cleaning gas radicals to form a byproduct and expose the ceramic coating, the exposed ceramic coating having a third emissivity level that is within 2 percent of the first emissivity level; and
exhausting the byproduct from the processing chamber.

8. The method of claim 7, wherein the cleaning gas comprises a chlorine containing gas.

9. The method of claim 8, wherein the chlorine containing gas is selected from the group consisting of $Cl_2$, ICl, HCl, $BCl_3$, $CCl_4$, $CH_3Cl$ and combinations thereof.

10. The method of claim 9, wherein the electrical bias is a negative electrical bias.

11. The method of claim 10, wherein the deposition process is a MOCVD process.

12. The method of claim 11, further comprising performing another deposition process on one or more additional substrates after exhausting the byproduct.

13. The method of claim 1, wherein the cleaning occurs in-situ.

* * * * *